United States Patent [19]

Wu et al.

[11] 4,064,029

[45] Dec. 20, 1977

[54] METHOD OF MAKING AN IMPROVED SUPERCONDUCTING QUANTUM INTERFERENCE DEVICE

[75] Inventors: Cheng-Teh Wu, Hinsdale; Charles M. Falco, Woodridge; Robert T. Kampwirth, Darien, all of Ill.

[73] Assignee: The United States of America as represented by the United States Energy Research and Development Administration, Washington, D.C.

[21] Appl. No.: 766,653

[22] Filed: Feb. 8, 1977

[51] Int. Cl.$^2$ .................. C23C 15/00; G01R 33/02
[52] U.S. Cl. ................. 204/192 S; 29/599; 324/248
[58] Field of Search ............ 204/192 S; 29/599; 427/62; 324/43 R

[56] References Cited

PUBLICATIONS

J. Clarke, "Low-Frequency Applications of Superconducting Quantum Interference Devices," Proc. IEEE, vol. 61, Jan. 1973, pp. 8-19.

K. Murata et al., "A Simple Strong Squid," Japanese J. Appl.. Phys., vol. 15, pp. 733-734, Apr. 1976.

T. Fujita et al., "Fabrication & Performance of NbN Thin Film Planar Squids," IEEE Trans. on Magnetics, vol. Mag-11, Mar. 1975, pp. 739-742.

L. B. Holdeman et al., "Niobium Microbridges for Squid Applications," IEEE Trans. on Magnetics, vol. Mag-11, Mar. 1975, pp. 782-784.

Primary Examiner—F.C. Edmundson
Assistant Examiner—Aaron Weisstuch
Attorney, Agent, or Firm—Dean E. Carlson; Frank H. Jackson; Donald P. Reynolds

[57] ABSTRACT

An improved superconducting quantum interference device is made by sputtering a thin film of an alloy of three parts niobium to one part tin in a pattern comprising a closed loop with a narrow region, depositing a thin film of a radiation shield such as copper over the niobium-tin, scribing a narrow line in the copper over the narrow region, exposing the structure at the scribed line to radiation and removing the deposited copper.

8 Claims, 4 Drawing Figures

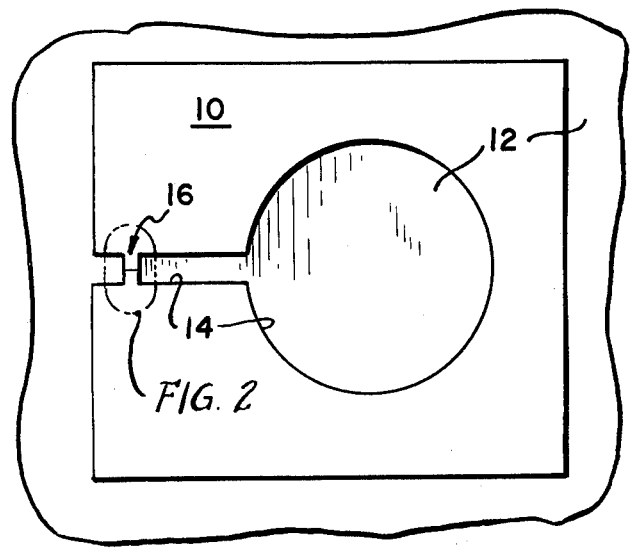
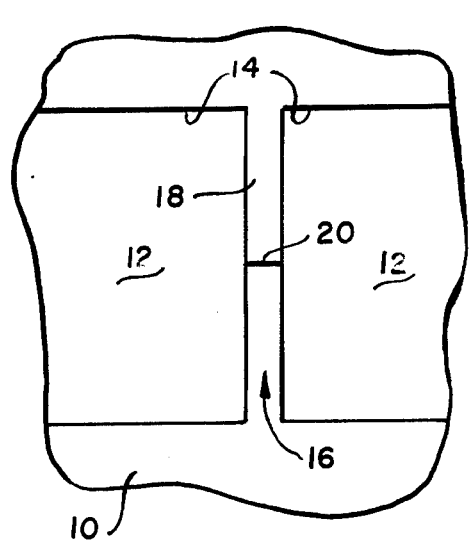
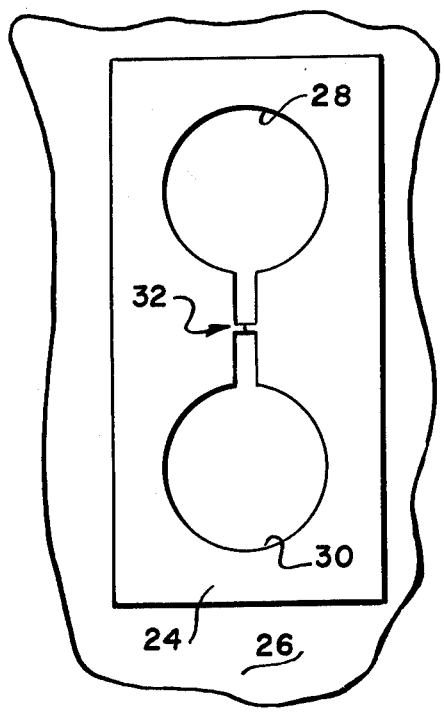
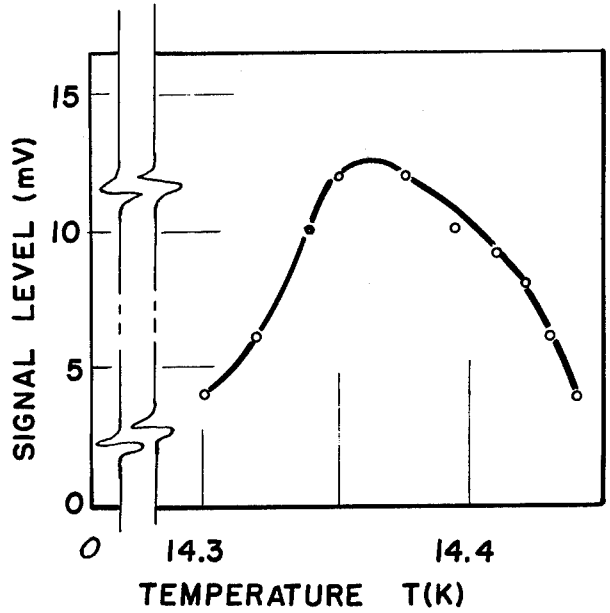

METHOD OF MAKING AN IMPROVED SUPERCONDUCTING QUANTUM INTERFERENCE DEVICE

CONTRACTUAL ORIGIN OF THE INVENTOR

The invention described herein was made in the course of, or under, a contract with the UNITED STATES ENERGY RESEARCH AND DEVELOPMENT ADMINISTRATION.

BACKGROUND OF THE INVENTION

This invention relates to superconducting quantum interference devices (SQUIDs).

The SQUID is a well-known device that is useful for measuring extremely low-level changes in magnetic fields and in measuring magnetic fields of extremely low magnitudes. The SQUID is a closed loop of superconducting material in which a portion of the loop, referred to as the weak link, is caused to have weakened superconductivity or to be a non-superconducting substance. This is desirable because a loop that is closed and is strongly superconducting is required by the principles of quantum mechanics to enclose magnetic fields in units of discrete quanta. One quantum of magnetic flux is of the order of $2 \times 10 \exp(-15)$ webers and it is impossible to measure changes of magnetic flux in increments smaller than this using a superconducting loop. The introduction of a weak link into the superconducting loop destroys the quantization and makes it possible to measure magnetic flux in quantities smaller than one quantum of flux.

The foregoing facts are well known and have been described in numerous journal articles and patents. SQUIDs are available commercially for measurements of extremely small magnetic fields and for measurements of extremely small changes in magnetic fields that are not themselves necessarily that small. However, only one SQUID is known to have been made to date using superconducting materials that operate at temperatures above 10 K. This is niobium nitride in single crystal form that is grown epitaxially on a substrate of magnesium oxide. Such devices are limited to planar geometry and have not appeared to be feasible for commercial production because the weak link in niobium nitride can be made only by mechanical scribing. This leads to properties that are not readily reproduced. All other such devices have the disadvantage that liquid helium is required to cool them to operating temperatures. Liquid helium is quite difficult to use outside a laboratory, as for example in applications such as aerial prospecting, where an extremely sensitive magnetometer is of much use. The application of SQUIDs could be extended if they could be used at temperatures achievable with closed-cycle refrigeration systems instead of liquid helium.

It is an object of the present invention to provide a method of making an improved SQUID.

It is a further object of the present invention to provide a method of making a SQUID that is operable at temperatures achievable by closed-cycle refrigeration systems.

It is a further object of the present invention to provide a method of making a SQUID using a thin film of an alloy of 3 parts niobium to one part tin.

Other objects will become apparent in the course of a detailed description of the invention.

SUMMARY OF THE INVENTION

A thin-film SQUID operable at temperatures above 10 K is produced by sputtering a thin film of an alloy of 3 parts niobium to one part tin on a substrate in a shape that comprises a closed loop with a narrow portion. The sputtered material is then covered with an evaporated coating of a radiation shield such as copper which is scratched through at the narrow portion in a direction that is transverse to the loop. The area of superconductor exposed or nearly exposed by scratching the shield is subjected to particle radiation in controlled amounts to make a weak link, after which the remaining radiation shield is removed. The resulting device comprises a thin-film SQUID.

BRIEF DESCRIPTION OF THE DRAWINGS

FIG. 1 is a view of a thin-film SQUID formed by the method of the present invention.

FIG. 2 is an enlarged view of a portion of FIG. 1 showing the weak link.

FIG. 3 is a view of a thin-film differential SQUID that is also produced by the method of the present invention.

FIG. 4 is a plot of signal level obtained on a thin-film SQUID produced by the method of the present invention.

DETAILED DESCRIPTION OF THE INVENTION

FIG. 1 is a view of a thin-film SQUID. In FIG. 1 a thin film 10 of an alloy comprising three parts niobium to one part tin has been formed on a substrate 12 of a material such as sapphire selected to support the thin film and withstand the processes of sputtering and etching and to be usable at cryogenic temperatures of the order of 10 K. Thin film 10 is placed to a thickness in the range of 20 to 500 nanometers on substrate 12 in a pattern that forms a loop about opening 14. One portion of the loop of thin film 10 is weak-link region 16 which is shown in expanded view in FIG. 2. Weak-link region 16 includes a strip 18 of niobium-tin alloy that is of the order of 5 to 30 micrometers in width and has a length of the order of 250 micrometers. Weak link 20 is a very short portion of material that is weakly superconducting. The weak link has a thickness of the order of 0.5 to 5 micrometers. This is a distance that is sufficiently small to permit tunneling of paired electrons to comprise the conduction of current in a closed circuit around the superconducting link. While the requirements on the weak link are only that it be extremely short, small in cross-section, and weakly superconducting, the desirability of making a thin-film SQUID leads to a method of making the weak link that involves weakening or destroying the superconductivity of a small region of the niobium-tin alloy that is used as the superconductor in the remainder of the device.

FIG. 3 is a representation of an alternate embodiment of an apparatus produced by the method of the present invention. This is an apparatus in which two loops are in parallel with the same weak link. In FIG. 3 thin film 24 of an alloy of 3 parts niobium to one part tin is deposited by sputtering on substrate 26 in a pattern that leaves two openings 28 and 30. Weak-link region 32 is identical to the weak-link region 16 of FIGS. 1 and 2, and the method of making the structure of FIG. 3 is the same as the one to be described below for the SQUID of FIG. 1. The device of FIG. 3 is useful for making differential measurements of magnetic fields comparing the fields enclosed in openings 28 and 30, whereas the SQUID of FIG. 1 is useful for making absolute measurements of the magnetic field through opening 14. Structures such as those of FIGS. 1, 2 and 3 are known in the art as described above. The present invention comprises a new method of making such structures that have the advantage of being operable at temperatures achievable by closed-cycle refrigeration systems. This avoids the use of liquid helium for achieving the necessary cryogenic temperatures and thus extends the use of SQUIDs to places where it is impossible or very difficult to use liquid helium. The method of manufacture comprises the following steps. A thin film of an alloy of three parts niobium to one part tin is sputtered onto a prepared substrate such as substrates 12 and 26. A pattern with an open loop, such as that of FIG. 1, or two loops, such as that of FIG. 3, or any appropriate such pattern is achieved in the thin film either by masking during sputtering or by conventional techniques of photoetching after the thin film has been sputtered. A thin film of copper is then sputtered over the entire film of niobium-tin. A line of width in the range 0.5 to 5 micrometers is scratched as with a razor blade at the desired location of the weak link, leaving a thin groove in the copper. The surface is exposed to radiation of alpha particles in an accelerator. The copper plating should be thick enough so that the available energy range of the alpha particles ensures that all of the structure is protected against radiation damage except the region of the scratch. Radiation will then reach the niobium-tin alloy only at the scratch to damage its superconducting properties there. The copper is then removed from the surface leaving a completed thin-film SQUID.

SQUIDs have been made according to the method of the present invention at the Argonne National Laboratory. An alloy of three parts niobium to one part tin was sputtered on a substrate of sapphire to thicknesses of 50 to 100 nanometers. This deposit was photoetched and the excess alloy was removed to leave patterns of niobium-tin similar to those of FIGS. 1 and 3. Copper was then deposited to cover the niobium-tin to thicknesses of the order of 400 nanometers. This material and thickness were chosen because of the properties of the available accelerator. The structures were then irradiated with accelerated alpha particles at an energy of 50 KeV to a dosage of the order of 10 exp (14) ions per square centimeter. After removal from the accelerator, the structure was treated with nitric acid to remove the copper, leaving a SQUID.

Results of measurements on one such SQUID are shown in FIG. 4, which is a plot of observed voltage as a function of temperature. The voltage is obtained by exposing the SQUID to a flux change of approximately one quantum (2 × 10 exp (−15) webers) peak to peak at a frequency of 19 MHz. The curve of FIG. 4 is seen to achieve a maximum voltage at a temperature of approximately 14.36 K. This can be achieved by closed-cycle refrigeration systems. As the temperature increases above this point, the superconductivity begins to decrease in the main loop of the SQUID, reducing the output. Below the peak, the weak link becomes more nearly superconducting, thus reducing the output for a flux change of one quantum. The signal level could clearly be extended beyond the points shown, however, by routine measures obvious to one skilled in the art. These measures, characteristic of the measurement of small voltages, include especial attention to grounding and to electrostatic shielding to reduce the interference of electrical noise. Even without such measures, the curve of FIG. 4 shows a SQUID operable over a useful range of temperatures that is high enough to be achievable by commercially available closed-cycle refrigeration equipment.

While copper was used as an alpha shield to produce the SQUID of FIG. 4, it should be understood that other types of shielding could equally as well be used, as could other types of radiation. Bombardment by electrons, neutrons, or heavy ions would work as well, requiring only the selection of an appropriate material such as aluminum or lead in a thickness appropriate to stop bombarding particles everywhere except at the line marked to make the weak link. A razor blade was used to mark the line, but this was only one choice. A scriber or a ruling machine would function as well to remove enough of the protective material to allow the superconducting material to be damaged enough by bombardment to generate a weak link.

The embodiments of the invention in which an exclusive property or privilege is claimed are defined as follows:

1. A method of making a thin-film SQUID on a substrate comprising the following steps:
   sputtering an alloy of three parts niobium to one part tin in a desired closed loop pattern on the substrate;
   depositing a shielding material over the sputtered alloy;
   removing a portion of the shielding material in a thin line across said loop in a desired region;
   exposing the line to particle radiation; and
   removing the shielding material.

2. The method of claim 1 wherein the closed pattern is photoetched to remove a portion of the alloy to leave a closed loop with a narrow region.

3. The method of claim 2 wherein the desired region for removing a portion of the shielding material is across the narrow region in the closed loop.

4. The method of claim 3 wherein the step of removing a portion of the shielding material comprises scratching a line in the shielding material.

5. The method of claim 3 wherein the shielding material is copper.

6. The method of claim 3 wherein the radiation is a beam of alpha particles.

7. The method of claim 3 wherein the shielding material is lead and the radiation is a beam of neutrons.

8. A method of making a thin-film SQUID on a substrate of sapphire comprising the steps of:
   sputtering an alloy of three parts niobium to one part tin to a thickness in the range of 20 to 500 nanometers on the substrate;
   photoetching the alloy to leave a closed loop with a narrow region;
   depositing copper on the alloy to a thickness of about 400 nonometers;
   scratching substantially through the copper with a razor blade to cross the narrow region;
   exposing the scratched area to radiation by alpha particles at an energy of about 50 KeV and a flux of about $10^{14}$ ions per square centimeter; and
   removing the copper with nitric acid.

* * * * *